United States Patent [19]
Lattimore et al.

[11] Patent Number: 5,870,349
[45] Date of Patent: Feb. 9, 1999

[54] DATA PROCESSING SYSTEM AND METHOD FOR GENERATING MEMORY CONTROL SIGNALS WITH CLOCK SKEW TOLERANCE

[75] Inventors: George McNeil Lattimore, Austin; Robert Anthony Ross, Jr., Cedar Park; Mithkal Moh'd Smadi, Round Rock, all of Tex.

[73] Assignee: International Business Machines Corporation, Armonk, N.Y.

[21] Appl. No.: 959,653

[22] Filed: Oct. 28, 1997

[51] Int. Cl.$^6$ ........................................ G11C 7/00
[52] U.S. Cl. ...................... 365/230.06; 365/194
[58] Field of Search ................. 365/230.06, 194, 365/233, 230.05

[56] References Cited

U.S. PATENT DOCUMENTS

| | | | |
|---|---|---|---|
| 4,366,558 | 12/1982 | Homma et al. | 365/189 |
| 4,608,669 | 8/1986 | Klara et al. | 365/201 |
| 4,803,663 | 2/1989 | Miyamoto et al. | 365/189 |
| 4,980,860 | 12/1990 | Houston et al. | 365/189.11 |
| 5,107,459 | 4/1992 | Chu et al. | 365/63 |
| 5,144,583 | 9/1992 | Oowaki et al. | 365/206 |
| 5,214,601 | 5/1993 | Hidaka et al. | 365/63 |
| 5,292,678 | 3/1994 | Dhong et al. | 437/50 |
| 5,459,851 | 10/1995 | Nakajima et al. | 395/476 |
| 5,468,985 | 11/1995 | Harima | 257/385 |
| 5,563,820 | 10/1996 | Wada et al. | 365/63 |
| 5,567,963 | 10/1996 | Rao | 257/296 |
| 5,577,003 | 11/1996 | Fuji | 365/230.06 |
| 5,581,126 | 12/1996 | Moench | 257/776 |
| 5,586,072 | 12/1996 | Longway et al. | 365/63 |

*Primary Examiner*—Vu A. Le
*Attorney, Agent, or Firm*—Winstead Sechrest & Minick P.C.; Elizabeth A. Apperley; Anthony V. S. England

[57] ABSTRACT

The data processing system of the present invention implements a multi-port memory cell, wherein the port functions are divided based on a timing cycle in which they may be accessed. For example, in one case, a first port may be utilized only for read operations and accessed only during a first portion of the timing cycle. Similarly, a second port may be used for read or write operations a and may be accessed only during a second portion of the timing cycle. To ensure that the multi-port memory cell functions correctly, both ports should not be accessed simultaneously. A circuit and method are implemented to ensure that both ports are not accessed simultaneously by implementing a delay function in a unique and useful manner.

20 Claims, 9 Drawing Sheets

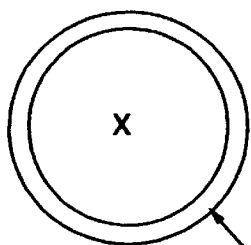
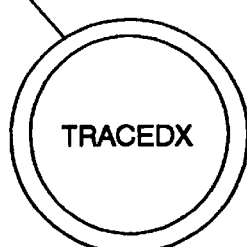
FIG. 3
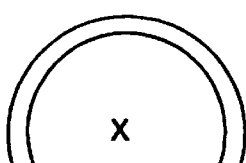
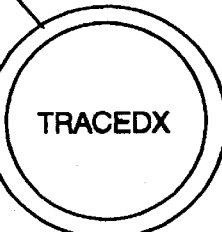
FIG. 4
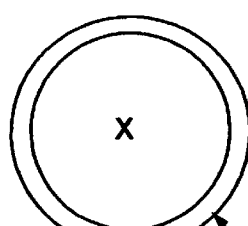
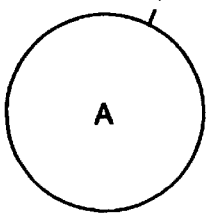
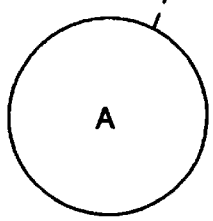
FIG. 5

DATA PROCESSING SYSTEM AND METHOD FOR GENERATING MEMORY CONTROL SIGNALS WITH CLOCK SKEW TOLERANCE

CROSS-REFERENCE TO RELATED, CO-PENDING APPLICATION

This application is related to the commonly assigned, co-pending patent applications filed simultaneously herewith and entitled:

"A Data Processing System and Method for Implementing a Multi-Port Memory Cell," by George M. Lattimore, et al., Attorney Docket No. AT9-97-364;

"A Memory System Having a Vertical Bitline Topology and Method Therefor," by George M. Lattimore, et al., Attorney Docket No. AT9-97-125; and "Method and Apparatus for Single Clocked, Non-Overlapping Access in a Multi-Polt Memory Cell," by George M. Lattimore, et al., Attorney Docket No.

AT9-97-530, which are hereby incorporated by reference herein.

TECHNICAL FIELD

The present invention relates in general to a data processing systems, and in particular, to memories within the data processing system.

BACKGROUND INFORMATION

As technology advances, new semiconductor memory devices have been required to store more information and to communicate that information more quickly. A dual-port memory structure is one such memory device that provides data in an efficient manner desired by current data processing systems. In a dual port memory, two ports are implemented so that the contents of the memory may be concurrently accessed from two different sources. An example of such a dual port memory is illustrated in FIG. 1.

In the dual port memory cell of FIG. 1, transistors 106, 108, 110, and 112 form a latch for storing data within the memory cell. In contrast, transistors 104, 102, 114, and 116 are pass devices that allow data to be stored within and read from the memory cell. Through the selective enabling of the "latch" transistor and the "pass" transistors, data is stored within and read from the dual-port memory cell. However, the use of multiple pass devices within this memory cell may result in a "read disturb" problem, whereby the data in the memory cell is incorrectly read due to improper current distribution when the cell is read. To explain such "read disturb" problems in greater detail, a detailed explanation of operation of a dual-port memory cell will now be provided.

Assume in the memory cell of FIG. 1 that node 1, N1, has a logic one value thereon. Conversely, node 0 (N0) has a logic zero value thereon. Furthermore, assume that nodes $BL_0$, $\overline{BL_0}$, $BL_1$, and $\overline{BL_1}$, are all precharged to a logic high value when the P1WL and the P2WL signals are a logic low value. Subsequently, when the P2WL signal is asserted, transistor 116 forms a pass device which has a logic low on one side and a logic high value on the other side. When a pass device, such as transistor 116 is enabled by a wordline (Q2 P2WL, in this example), the pass device is operating a saturation region. Note that transistor 112 is in a linear mode of operation when either wordline is enabled ("turned on") because $V_{DS}=0$ and $V_{DS}< V_{GS}-V_T$. When such a differential exists, transistor 112 in the linear is required to transfer the same current as transistor 116 in the saturation mode. If transistor 112 is the same size (w/l (width/length) ratio) as transistor 116, transistor 112 will not be able to "sink" all the current through node N0 without node N0 rising significantly above a ground reference voltage. As node N0 rises above ground to a threshold voltage, Vtn, above the ground reference voltage, transistor 108 is enabled to conduct current. As transistor 108 is enabled to conduct current, the two inverters will contend with one another. If node N0 continues to rise, the latch in the cross-coupled cell will eventually flip its logic state, and Node 0 will become a logic one value. Therefore, if transistor 112 cannot sink the same current that transistor 116 is sourcing, the voltage level on node N0 will become too high, the contents of the latch formed by transistors 106, 108, 110, and 112 will be disturbed, and the contents of the latch will switch to an opposite logic state, referred to as a read disturb.

To compensate for such potential disturbances, designers of memory systems, typically calculate a critical beta ratio to ensure that the memory cell will continue to operate properly, even during a read operation. This critical ratio is a ratio between the device size (w/l) of a latch device (such as transistor 112) and a pass device (such as transistor 116). Typically, the latch device must have a larger size (w/l) than the pass device. The beta ratio is defined as an effective width ($W_{eff}$) over an effective length ($L_{eff}$) of a transistor 112 divided by of effective width ($W_{eff}$) over effective length ($L_{eff}$) of transistor 116 or:

$$\frac{W_{eff}-112 \times L_{eff}-116}{L_{eff}-112 \times W_{eff}-116}$$

In the case of a single-port memory cell, the will ratio of the latch device should be at least two times the w/l ratio of the pass device. By making this critical ratio approximately two, a circuit designer is assured that the pass device, transistor 112, while operating in a low VDS region is able to sink the current from the latch device when it is operating in a high VDS region.

To further complicate matters, in a dual port memory cell, two pass devices can potentially be driving concurrently current to a node (such as node N0). When this second pass device is used, a beta ratio between the pass devices and the latch devices must be increased by two times since there will be twice as much current as there are twice as many pass devices. Such an increased beta ratio is reflected in increased circuit area requirements which, in turn, increase the costs associated with manufacturing the circuit.

Therefore, a need exists for a method of accessing dual port memories which reduces an amount of circuit area requirements, while maintaining the functionality typically associated with such dual port memories.

SUMMARY OF THE INVENTION

The previously mentioned needs are fulfilled with the present invention. Accordingly, there is provided, in a first form, a circuit. The circuit includes an input circuit for receiving a first input signal and a second input signal. The circuit also includes a delay circuit for receiving the second input signal and allying the second input signal to provide a delayed second input signal and delaying the first input signal to provide a delayed first input signal. The circuit includes a first logic circuit for selectively asserting an active logic state for a first output signal in response to the first input signal and the delayed second input signal. The circuit includes a second logic circuit for asserting an active logic state for a second output signal in response to the second input signal and the delayed first input signal. Only one of the active states is asserted at a time.

Additionally, there is provided, in a second form, a circuit for providing a plurality of output signals. The circuit includes a delay circuit for receiving a first clock signal and a second clock signal. The delay circuit delays the first clock signal to provide a first delayed clock signal and delays a second clock signal to provide a second delayed clock signal. A first logic circuit has a first input connected to the delay circuit for receiving the second delayed clock signal and a second input for receiving the first clock signal. The first logic circuit has a third input for receiving a first data signal. The first logic circuit selectively asserts a first internal node in response to the second delay clock signal, the first clock signal, and the first data signal. A first restore circuit is connected to the first logic circuit for selectively negating the first internal node in response to one of the first clock signal and the second delay clock signal, wherein the first restore circuit selectively negates the first internal node before a second internal node is asserted.

Furthermore, there is provided, in a third form, a circuit. The circuit includes an input circuit for receiving a first input signal on a second input signal. The circuit also includes a delay circuit for delaying the first input signal to provide a delayed first input signal and for delaying the second input signal to provide a delayed second input signal. The circuit also includes a logic circuit for receiving the first input signal, the second input signal, the delayed second input signal and the delayed first input signal. The logic circuit selectively places a first output signal and a first logic state in response to the first input signal and the delayed second input signal. The logic circuit places a second output signal and a second logic state in response to the second input signal and the delayed first input signal. The first output signal and the second output signal are non-overlapping.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates, in block diagram form, a sub-array in accordance with one embodiment of the present invention;

FIG. 4 illustrates a portion of a wordline driver in accordance with one embodiment of the present invention;

FIG. 5 illustrates, in timing diagram form, a timing relationship between a plurality of inputs to the portion of the wordline driver of FIG. 4;

DETAILED DESCRIPTION

Figure 1:
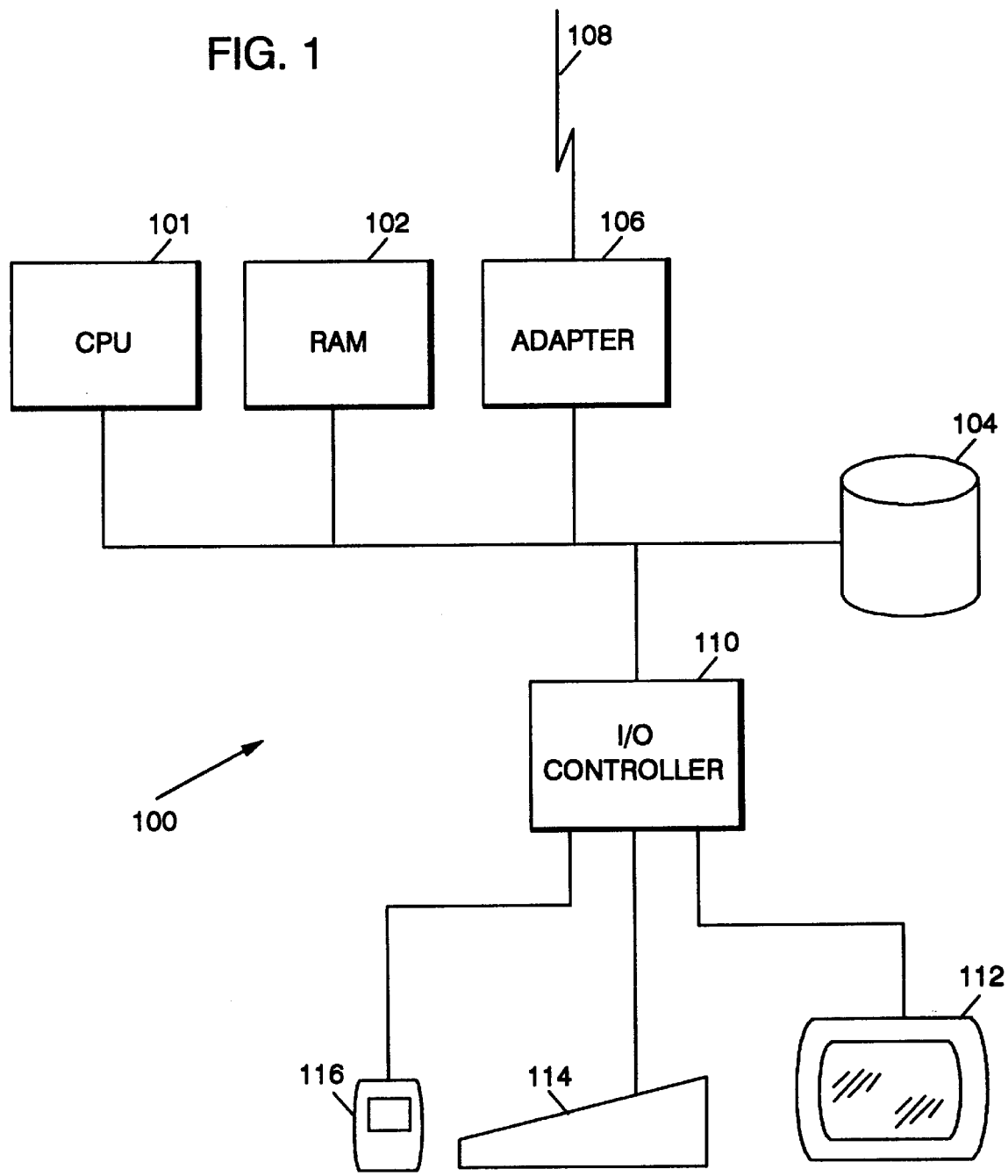
FIG. 1 illustrates, in circuit diagram form, a dual-port memory cell.

In the present invention, a wordline driver circuit and method of operation are designed to efficiently implement a dual-port memory cell without consuming a large amount of circuit area. In one embodiment of the present invention, a first port of a dual-port memory cell is accessed in a first half of the timing cycle and a second port of the memory cell is accessed in a second half of the timing cycle. More specifically, in the first half of the timing cycle, a read operation from a first port may be performed, while during the second half of the timing cycle, a read or write operation may be performed using the second port of the dual-port memory cell. By dividing the timing cycles into different accesses, different wordlines may be disabled when not used. Therefore, a first wordline may only be enabled when a second wordline is disabled, and vice versa. If this convention is utilized, a node of a latch within the memory cell never has both pass devices active and sourcing charge at the same time. Therefore, the devices in the memory cell do not have to be as large to prevent a read disturb.

To satisfy the aforementioned convention, the present invention insures that a first wordline and a second wordline are always substantially out of phase. Such a requirement tends to be problematic when both wordlines in a dual-port memory cell are switching concurrently. The present invention ensures that two wordlines in a dual-port memory cell are never enabled for the same time, even when a clock is used to enable the wordlines. The use of a clock to enable the wordlines is often problematic as clock skew often occurs. The occurrence of clock skew complicates the issues associated with insuring that wordlines provided to a dual-port memory cell are out of phase and non-overlapping.

The following description of the present invention will describe operation of the present invention in greater detail. However, prior to this discussion, a description of connectivity of the present invention will be described in greater detail.

DESCRIPTION OF CONNECTIVITY

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art. Furthermore, during the description of the implementation of the present invention, the terms "assert" and "negate" and various grammatical forms thereof, are used to avoid confusion when dealing with a mixture of "active high" and "active low" logic signals. For example, in FIG. 4, the P2WL and P1WL signals are "active high," and the INTWL1 and INTWL2 signals are "active low." "Assert" and "active" are used to refer to the rendering of a logic signal or register bit into its active, or logically true state. "Negate" and "inactive" are used to refer to the rendering of a logic signal or register bit into logically false state. The conventions described above may vary from signal to signal within one embodiment of a circuit. Thus, within a single circuit, one signal may be asserted or active when the logic signal or register bit is rendered to a logic high value, while another signal is also referred to as asserted or active when the logic signal or registered bit is rendered into a logic low value. Additionally, even with respect to the same signal at different points in time or at different points in the circuit, the convention described above may be used for describing that signal. Thus, for example, a first signal may be considered asserted when it is then a logic high value at one point in the circuit, while it may be considered "asserted" when it is at a logic low level in another portion of the circuit. Additionally, a hexadecimal value may be indicated by a "$" symbol preceding a value.

A description of connectivity for each of the illustrated embodiments of the present invention will now be described. It should be noted that operation of each of these figures will subsequently be described in greater detail.

Figure 2:
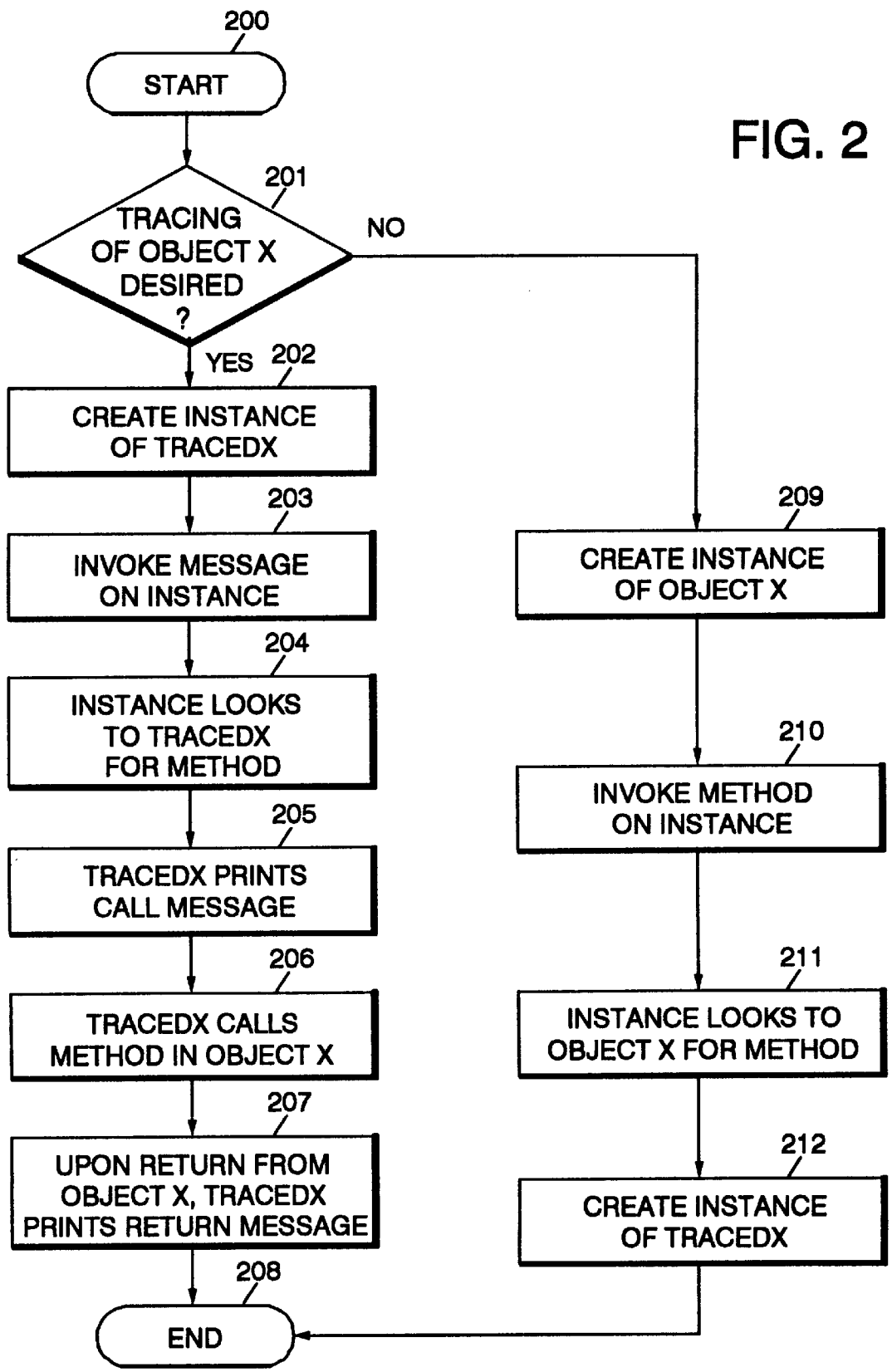
FIG. 2 illustrates, in block diagram form, a data processing system in accordance with one embodiment of the present invention.

Referring first to FIG. 2, an example is shown of a data processing system 200 which may be used for the invention. The system has a central processing unit (CPU) 210, such as a PowerPC microprocessor ("PowerPC" is a trademark of IBM Corporation) according to "The PowerPC Architecture: A Specification for a New Family of RISC Processors", 2d edition, 1994, Cathy May, et al. Ed., which is hereby incorporated herein by reference. A more specific implementation of a PowerPC microprocessor is described in the "PowerPC 604 RISC Microprocessor Users Manual", 1994, IBM Corporation, which is hereby incorporated herein by reference. The history buffer (not shown) of the present invention is included in CPU 210. The CPU 210 is coupled to various other components by system bus 212. Read only memory ("ROM") 216 is coupled to the system bus 212 and includes a basic input/output system ("BIOS") that controls certain basic functions of the data processing system 200. Random access memory ("RAM") 214, I/O adapter 218, and communications adapter 234 are also coupled to the system bus 212. I/O adapter 218 may be a small computer system interface ("SCSI") adapter that communicates with a disk storage device 220. Communications adapter 234 interconnects bus 212 with an outside network enabling the data processing system to communication with other such systems. Input/Output devices are also connected to system bus 212 via user interface adapter 222 and display adapter 236. Keyboard 224, track ball 232, mouse 226 and speaker 228 are all interconnected to bus 212 via user interface adapter 222. Display monitor 238 is connected to system bus 212 by display adapter 236. In this manner, a user is capable of inputting to the system throughout the keyboard 224, trackball 232 or mouse 226 and receiving output from the system via speaker 228 and display 238. Additionally, an operating system such as AIX ("AIX" is a trademark of the IBM Corporation) is used to coordinate the functions of the various components shown in FIG. 2.

FIG. 3 illustrates a memory 214 in greater detail. Memory 214 comprises a wordline decoder 302, a plurality of memory cell 304, a bitline decoder 306, and I/O circuit 308, and a wordline driver 310. Wordline decoder 302 is coupled to wordline driver 310 to provide a plurality of decoded data. Wordline driver 310 is coupled to the plurality of memory cells to provide the plurality of decoded data. Additionally, bitline decoder 306 is coupled to the plurality of memory cells 304 to communicate data which has been decoded or will be decoded. I/O 308 is coupled to bitline decoder 306 to communicate data with bitline decoder 306 and to determine a value which corresponds to that data.

FIG. 4 illustrates a portion of wordline driver 310. The portion of wordline driver 310 comprises a transistor 402, a transistor 404, an inverter 406, an inverter 408, an inverter 410, a transistor 412, a transistor 414, an inverter 416, a transistor 418, a transistor 420, an inverter 422, a transistor 424, a transistor 426, an inverter 428, an inverter 430, an inverter 432, a transistor 434, a transistor 436, an inverter 438, a transistor 440, an inverter 442, a transistor 444, a transistor 446, and a transistor 448.

A first terminal of transistor 402 is coupled to a first reference voltage. The P2CLK signal is coupled to a second terminal of transistor 402, an input of inverter 410, a first terminal of transistor 414, and an input of inverter 442. A third terminal of transistor 402 is coupled to a first terminal of transistor 404, an input of inverter 408, an output of inverter 406, and a first terminal of transistor 412. A second terminal of transistor 404 is coupled to the first reference voltage. A third terminal of transistor 404 is coupled to an output of inverter 422 and a first terminal of transistor 418. An output of inverter 408 is coupled to an input of inverter 406, a first terminal of transistor 448, and a first terminal of transistor 420. A P2IN signal is provided to a second terminal of transistor 412. A third terminal of transistor 412 is coupled to a second terminal of transistor 414. A third terminal of transistor 414 is coupled to a second terminal of transistor 418. A third terminal of transistor 418 is coupled to the reference ground voltage. An output of inverter 410 is coupled to a second terminal of transistor 448. A third terminal of transistor 448 is coupled to the reference ground voltage. An input of inverter 416 is coupled to the output of inverter 422. An output of inverter 416 is coupled to a second terminal of transistor 420. A third terminal of transistor 420 is coupled to the reference ground voltage.

In FIG. 4, a P1CLK signal is coupled to an input of inverter 422, a first terminal of transistor 444, an input of inverter 432, and a first terminal of transistor 424. A P1IN signal is provided to a first terminal of transistor 446. An output of inverter 442 is coupled to a first terminal of transistor 426, a first terminal of transistor 440, and an input of inverter 438. A second terminal of transistor 440 is coupled to the reference ground voltage and a third terminal of transistor 440 is coupled to a second terminal of transistor 444. A third terminal of transistor 444 is coupled to a second terminal of transistor 446. A third terminal of transistor 446 is coupled to a second terminal of transistor 426, a second terminal of transistor 424, an output of inverter 428, and an input of inverter 430. An output of inverter 432 is coupled to a first terminal of transistor 434. An output of inverter 438 is coupled to a first terminal of transistor 436. A third terminal of transistor 426 is coupled to the first reference voltage and the third terminal of transistor 424 is coupled to the first reference voltage. An output of inverter 430 is coupled to an input of inverter 428, to a second terminal of fi transistor 434, and to a second terminal of transistor 436 to provide a P1WL signal. A third terminal of transistor 436 is coupled to the reference ground voltage and a third terminal of transistor 434 is coupled to the reference ground voltage. It should be noted that the structure of this portion of wordline decoder 310 is essentially the same for that for each of the other wordline decoders illustrated herein.

Figure 9:
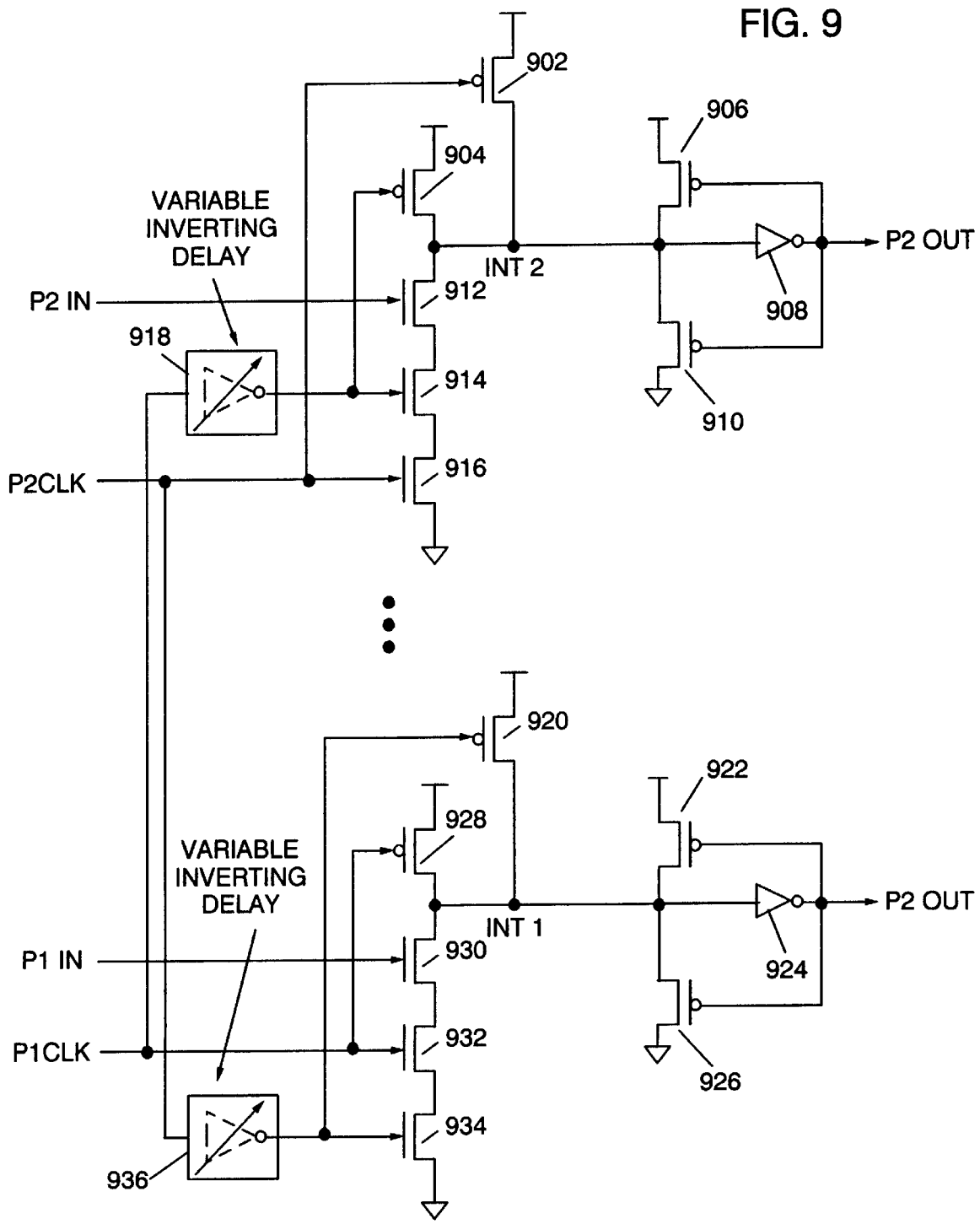
FIG. 9 illustrates, in circuit diagram form, a signal driver in accordance with one embodiment of the present invention.

FIG. 9 illustrates an alternate embodiment of the present invention. The driver circuit of FIG. 9 comprises a transistor 902, a transistor 904, a transistor 906, an inverter 908, a transistor 910, a transistor 912, a transistor 914, a transistor 916, a variable inverting delay circuit 918, a transistor 920, a transistor 922, an inverter 924, a transistor 926, a transistor 928, a transistor 930, a transistor 932, a transistor 934, and a variable inverting delay circuit 936.

A P2IN signal is provided to a first terminal Qf transistor 912. A P2CLK signal is provided to a first terminal of transistor 902, a first terminal of transistor 916, and an input of variable inverting delay circuit 936. A P1IN signal is provided to a first terminal of transistor 930. A P1CLK signal is provided to an input of variable inverting delay circuit 918, a first terminal of transistor 928, and a first terminal of transistor 932. A second terminal of transistor 902 is coupled to a first reference voltage and a third terminal of transistor 902 is coupled to a first terminal of each of transistors 906 and 910 and an input of inverter 908. An output of inverter 908 provides a P2OUT signal. The output of inverter 908 is coupled to a second terminal of transistor 906 and a second terminal of transistor 910. A third terminal of transistor 906 is coupled to a reference voltage and a third terminal of transistor 910 is coupled to a reference voltage.

An output of variable inverting delay circuit 918 is coupled to a first terminal of transistor 914 and a first terminal of transistor 904. A second terminal of transistor 904 is coupled to a reference voltage and a third terminal of transistor 904 is coupled to the input of inverter 908. A second terminal of transistor 912 is coupled to the third terminal of transistor 904. A third terminal of transistor 912 is coupled to a second terminal of transistor 914. A third terminal of transistor 914 is coupled to a second terminal of transistor 916. A third terminal of transistor 916 is coupled to a reference ground voltage.

A first terminal of transistor 920 is coupled to an output of variable inverting delay circuit 936 and a first terminal of transistor 934. A second terminal of transistor 920 is coupled to a reference voltage. A third terminal of transistor 920 is coupled to a second terminal of transistor 928, a second terminal of transistor 930, a first terminal of transistor 922, a first terminal of transistor 926, and an input of inverter 924. An output of inverter 924 provides a P1OUT signal. The output of inverter 924 is coupled to a second terminal of transistor 922 and a second terminal of transistor 926. A third terminal of transistor 922 is coupled to a reference voltage. A third terminal of transistor 926 is coupled to a reference voltage. A third terminal of transistor 928 is coupled to a reference voltage. A third terminal of transistor 930 is coupled to a second terminal of transistor 932. A third terminal of transistor 932 is coupled to a second terminal of transistor 934. A third terminal of transistor 934 is coupled to a reference voltage.

Figure 10:
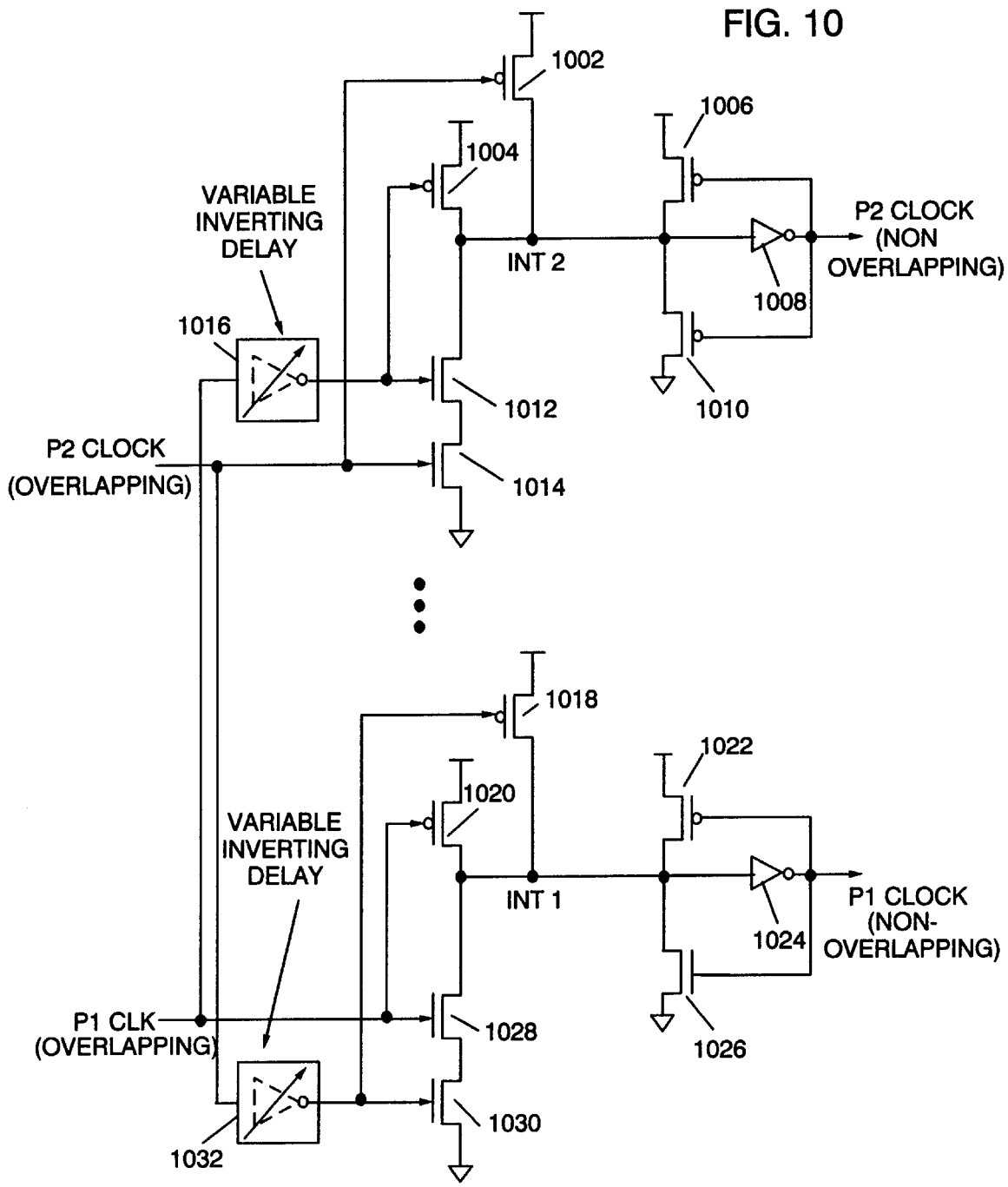
FIG. 10 illustrates, in circuit diagram form, a signal driver in accordance with one embodiment of the present invention.

FIG. 10 illustrates an alternate embodiment of a driver circuit. The driver circuit of FIG. 10 comprises a transistor 1002, a transistor 1004, a transistor 1006, an inverter 1008, a transistor 1010, a transistor 1012, a transistor 1014, a variable inverting delay circuit 1016, a transistor 1018, a transistor 1020, a transistor 1022, an inverter 1024, a transistor 1026, a transistor 1028, a transistor 1030, and a variable inverting delay circuit 1032.

A first terminal of transistor 1002 is coupled to a reference voltage, a second terminal of transistor 1002 is coupled to a P2CLK signal, and a third terminal of transistor 1002 is coupled to an input of inverter 1008. A first terminal of transistor 1004 is coupled to a reference voltage, a second terminal of transistor 1004 is coupled to an output of variable inverting delay circuit 1016, and a third terminal of transistor 1004 is coupled to a third terminal of transistor 1002. A first terminal of transistor 1006 is coupled to a reference voltage. A second terminal of transistor 1006 is coupled to an output of inverter 1008, and a third terminal of transistor 1006 is coupled to an input of inverter 1008. A first terminal of transistor 1010 is coupled to the input of inverter 1008, a second terminal of transistor 1010 is coupled to the output of inverter 1008, and a third terminal of transistor 1010 is coupled to a reference voltage. A first terminal of transistor 1012 is coupled to the third terminal of transistor 1004. A second terminal of transistor 1012 is coupled to an output of variable inverting delay circuit 1016 and a third terminal of transistor 1012 is coupled to a first terminal of transistor 1014. A second terminal of transistor 1014 is coupled to the P2CLK signal and a third terminal of transistor 1014 is coupled to a reference voltage.

A first terminal of transistor 1018 is coupled to a reference voltage, a second terminal of transistor 1018 is coupled to an output of variable inverting delay circuit 1032, and a third terminal of transistor 1018 is coupled to an input of inverter 1024. A first terminal of transistor 1022 is coupled to a reference voltage, a second terminal of transistor 1022 is coupled to an output of inverter 1024, and a third terminal of transistor 1022 is coupled to an input of inverter 1024. The output of inverter 1024 provides the P1CLK signal. A first terminal of transistor 1026 is coupled to the third terminal of transistor 1022, a second terminal of transistor 1026 is coupled to the output of inverter 1024, and a third terminal of transistor 1026 is coupled to a reference voltage. A first terminal of transistor 1020 is coupled to a reference voltage, a second terminal of transistor 1020 is coupled to the P1CLK signal, and a third terminal of transistor 1020 is coupled to the input of inverter 1024. A first terminal of transistor 1028 is coupled to the third terminal of transistor 1020, a second terminal of transistor 1028 is coupled to the P1CLK signal, and a third terminal of transistor 1028 is coupled to a first terminal of transistor 1030. A second terminal of transistor 1030 is coupled to an output of variable inverting delay circuit 1032, and a third terminal of transistor 1030 is coupled to a reference voltage. The P2CLK signal is coupled to an input of variable inverting delay circuit 1032. The P1CLK signal is coupled to an input of variable inverting delay circuit 1016.

Operation of the present invention using the configurations illustrated herein and presented above will subsequently be described in greater detail.

DESCRIPTION OF OPERATION

As previously mentioned, there exists a need for multi-port memory storage cells in high performance data processing systems. Such multi-port memory cells are used for read only operations, write only operations, or for both read and write operations. As is known in the data processing art, such read and write operations may occur in a same timing cycle.

In one embodiment of the present invention, a dual-port cell is accessed using the following protocol. A first port is utilized only for read operations and is accessed only during a first half of a timing cycle. A second port is used during read or write operations and is accessed only during a second half of the timing cycle. The use of first and second halves of timing cycles is well-known in the data processing art and a method for implementing such operations will not be described in detail herein. For additional information, refer to "200 MHz Internal 166 External 64 KB Embedded Virtual 3 Port Cache System," published in the proceedings of ISSC '94, which is hereby incorporated by reference herein.

When accesses to first and second ports of the dual-port memory cell are accessed independently and in different halves of the same timing cycle, both ports may not be simultaneously accessed. The present invention ensures that both ports will not be accessed simultaneously. This assurance allows for the implementation of a memory cell which requires smaller device sizes and, therefore, results in a smaller memory cell. To explain operation of the present invention, a general description of operation of the dual port memory will be provided herein.

During operation of the present invention, a dual-port memory cell is accessed by driving a wordline, such as P2WL or P1WL of FIG. 1, to enable a selected one of a plurality of memory cell transfer devices. When the wordline is asserted, a pass transistor is enabled to connect a corresponding bitline to the memory cell and to then communicate the contents of the cell. It should be noted that in the dual-port memory of the present invention, each port of the cell has a corresponding pair of transfer devices. For example, transfer devices for a first port in memory cell 204 of FIG. 1 are formed by transistors 104 and 114. Similarly, transfer devices for a second port of the memory cell 204 of FIG. 1 are formed by transistors 102 and 116. As previously mentioned, when the first port is accessed to allow an external user to read data from memory cell 204 and the second port is accessed to allow an external user to write data thereto, there is a concern that the data provided by the second port will corrupt the data "sensed" by the first port. However, in the present invention, the wordline drivers which selectively enable and disable the wordlines provided to the two ports are controlled by clocks using a dynamic logic circuit implementation. In an embodiment of the invention in an ideal environment, the clocks have opposite phases, but ideally have zero skew. However, in practice, the clocks can be skewed significantly. Therefore, if wordlines corresponding to both ports are directly controlled by the clocks, a potential exists for both ports to be enabled concurrently during a worst case of clock skew. However, this overlap may not be tolerated as the overlap will result in memory corruption due to read disturb occurrence.

To ensure that such overlap does not occur, the present patent application teaches a circuit which provides zero-overlap wordline signals when clock signals have no skew. Additionally, the present invention implements a negative overlap (positive non-overlap) output for wordline signals when the clock skew between the two clocks is positive or negative. Furthermore, in one embodiment of the present invention, an amount of "non-overlap" increases as a clock skew increases. By providing such an implementation, the present invention ensures that one wordline is not enabled before the other wordline is disabled. Specific operation of the present invention will now be discussed in greater detail.

Figure 11A:
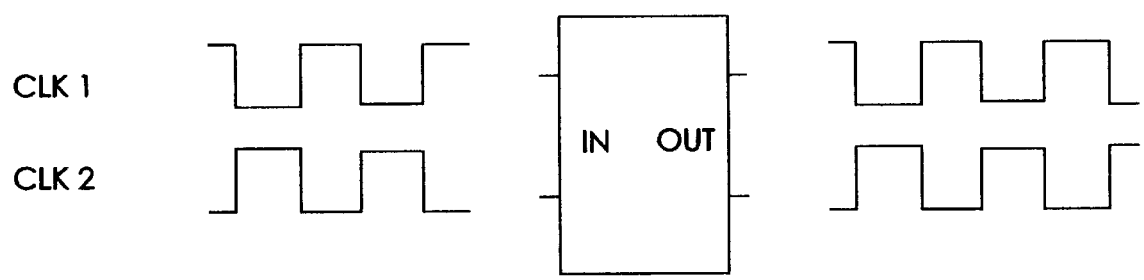
FIG. 11A,B and C illustrate, in modified timing diagram form, a logical representation of the embodiment of the present invention.
Figure 11B:
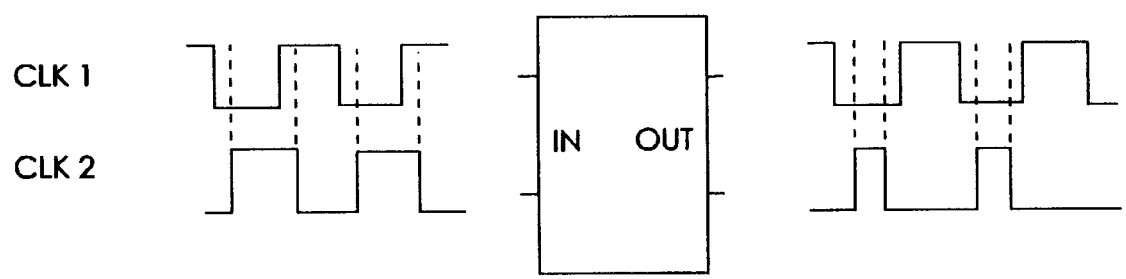
Figure 11C:
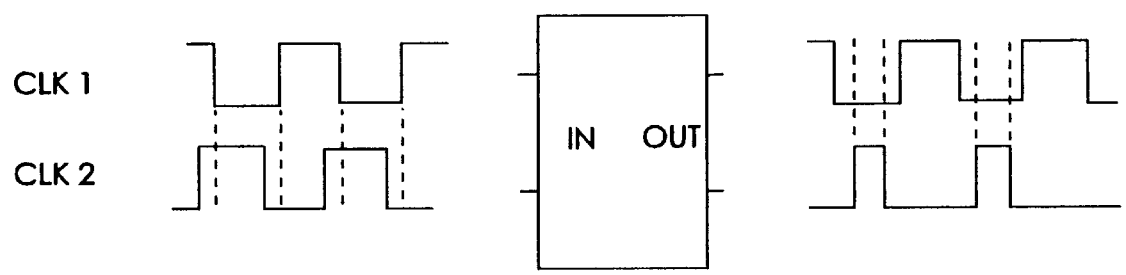

FIG. 11 illustrates the concept described above in greater detail. Refer now to FIG. 11. In a top portion of FIG. 11, labeled A, two signals, CLK1 and CLK2, are illustrated. Note that the CLK1 and CLK2 signals have no skew. After they are provided to the circuit of the present invention, there is still zero overlap between the resulting output signals. Section B of FIG. 11 illustrates two clock signals, C and CLK2, which have positive overlap. After these signals are provided to the circuit of the present invention, non-overlapping signals are generated. As is illustrated in Section B of FIG. 11, an amount of overlap in the input signals results in an increased non-overlap interval in the output signals. Section C of FIG. 11 illustrates the application of the non-overlap circuit of the present invention to two input signals which have negative overlapping. As may be seen from the output, the overlapped interval is negated and results in an increased non-overlapping interval on the outputs.

FIG. 2 illustrates data processing system 200 which implements one embodiment of the present invention. A memory, which utilizes the wordline drivers of the present invention is typically implemented within RAM device 214. It should be noted that RAM device 214 may be implemented as any type of dual-port memory known to those with skill in the relevant art, including SRAM memories.

Assume that RAM 214 has a configuration such as that illustrated in FIG. 3 in one embodiment of the present invention. In a portion of RAM 214 illustrated in FIG. 3, a wordline decoder decodes data provided by another portion of data processing system 200 to access one of the plurality of memory cells 304. The decoded data values are provided from wordline decoder 302 to wordline driver 310. Wordline driver 310 provides a plurality of wordlines to a corresponding one of the plurality of memory cells 304, and ensures that a first wordline and a second wordline are not simultaneously provided to the same memory cell. Additionally, input/output circuit 308 receives address information from bus 212, which are subsequently provided to bitline decoder 306. Bitline decoder 306 decodes the address values and provides the decoded values as bitline values to each of the plurality of memory cells 304.

While a system level description of operation of RAM 214 has been provided, a more detailed description of wordline driver 310 will be subsequently discussed. Wordline driver 310 is illustrated in greater detail in FIG. 4. In FIG. 4, a signal labeled P2IN is provided by wordline decoder 302 to enable wordline driver 310 to provide a Port Two Wordline (P2WL) signal to a selected portion of the plurality of memory cells 304. Additionally, in FIG. 4, a Port One Input (P1IN) signal is provided by wordline decoder 302 to wordline driver 310. Within wordline driver 310, the P1IN signal generates a port one wordline (P1WL) signal. Furthermore, in FIG. 4, the P2CLK signal indicates a Port 2 Clock signal which provides clocking information for a wordline provided to port two of each of a selected portion of the plurality of memory cells 304. Similarly, the P1CLK signal provides a clock signal for a wordline provided to port 1 of each of the selected portion of the plurality of memory cells 304. The P2CLK signal and the P1CLK signal are provided by a clock circuit (not illustrated herein). It should be noted that such clock circuits are well-known to those with skill in the relevant data processing art and, therefore, will not be described in detail herein. Operation of the portion of wordline driver 310 will subsequently be described in greater detail.

During operation of the present invention, assume that a user of data processing system 200 accesses a memory cell within RAM 214. To access this information, the user provides the appropriate address information to wordline decoder 302 and bitline decoder 306. Wordline decoder 302 provides a plurality of decoded wordlines, including the P2IN and P1IN signals, to wordline driver 310. Wordline driver 310 subsequently drives each of the plurality signals to the plurality of memory cells 304. It should be noted that the P2IN and P1IN signals are driven as the P2WL and P1WL signals.

During operation of a portion of wordline driver 310 in one embodiment of the present invention, the P2WL signal corresponds to port two of a selected memory cell and the P1WL signal corresponds to port one of the same memory cell within the plurality of memory cells 304.

In one embodiment of the present invention, the logic circuits of FIG. 4 are implemented as dynamic circuits. Therefore, when the P2CLK signal or the P1CLK signal is asserted, a corresponding dynamic circuit may be evaluated. Therefore, during a portion of a timing interval when the P1CLK signal is asserted, the P1WL signal will also be asserted. Similarly, during a portion of a timing interval when the P2CLK signal is asserted, the P2WL signal will also be enabled. Thus, both clocks are being used to enable a respective one of the wordlines provided to a dual-port memory cell within the plurality of memory cells 304. As previously mentioned, the present invention ensures the P2WL signal and the P1WL signal do not substantially overlap when asserted (i.e., are not simultaneously asserted).

During operation of wordline driver 310, transistor 446, transistor 444, and transistor 440 must all be enabled to negate the INTWL1 node (internal wordline 1). When the INTWL1 node is asserted, the P1WL signal is asserted to access the memory cell. Furthermore, when either transistor 426 or transistor 424 is enabled by providing a low logic level input signal to a p-channel device, the INTWL1 node will be negated. When the INTWL1 node is negated, the P1WL signal is negated, and the P1WL wordline is effectively "off." Conversely, each of transistors 412, 414, and 418 must be enabled to pull an internal node (INTWL2) to a logic low level. When the INTWL2 node is asserted, the P2WL signal is asserted. Conversely, if either transistor 404 or transistor 402 has an input which is negated, that transistor will pull the INTWL2 node to a high logic level. The P2WL signal will then be negated.

During operation, either transistor 426 or transistor 424 may be used to restore a value of P1WL to a logic low value. When this operation is performed, the P1CLK signal is not inverted, and there is a two transistor stage delay between the modification of the P1CLK signal and a remaining portion of wordline driver 310. Therefore, two transistor stages after the P1CLK signal is negated, the negated signal restores the P1WL signal through transistor 424. However, it is desired that both the P1CLK signal and the P2CLK signal be asserted to activate internal node, INTWL1. Therefore, the P2CLK signal is inverted using inverter 442. In this situation, there is always at least one additional inverter delay between the insertion of the P2CLK signal and the activation of node INTWL1.

It should be noted that transistors 402 through 422, and 448 function in a manner similar to transistors 424 through 436, respectively. As both circuits operate similarly, operation of the circuit providing the P2WL signal will not be described in greater detail herein.

In addition to the inverters which ensure that the P1WL and P2WL signals will not be concurrently asserted for a significant amount of time, inverter 432, transistor 434, transistor 436, and inverter 438 help in a restore operation. When the restore operation is invoked, transistor 424 is enabled and the P1 (port 1) CLK signal goes to a logic low level. Additionally, transistors 424 and 426 are manufactured with smaller device sizes, so that a forward path through the wordline driver port 1 is faster than the restore path through the wordline driver. Relative sizing of transistors within a circuit to increase speed is a technique well-known to those with skill in the art and, therefore, will not be described in greater detail herein.

Transistor 434 and transistor 436 are utilized to negate the P1WL signal. It should be noted that an n-channel transistor within inverter 430 is designed to only be large enough to hold the P1WL signal at a logic low value, but it is not large enough to switch the P1WL signal very quickly. However, the use of transistors 434 and 436 enable the P1WL signal to be switched more quickly.

Furthermore, inverter 428 is a feedback mechanism which holds data at node INTWL1 at a given value. Furthermore, if any of transistors 440, 444, or 446 are disabled, data is not lost due to a latch formed by inverters 428 and 430. Alternate embodiments could also be implemented to perform a similar feedback function. Such attentive latching operations and circuits are well-known to those with skill in the data processing art and, therefore, will not be described in further detail herein.

FIG. 5 illustrates the relationships between each of the input and output signals of a portion of wordline driver 310 of FIG. 4. As illustrated in FIG. 5, assume that a data value is provided to a first port, P1IN before a clock corresponding to the first port (P1CLK) is negated during a time t0. When the P1CLK signal is negated at time t1, transistor 424 is enabled. When transistor 424 is enabled, the INTWL1 node is pulled to a logic high value. This logic high value is subsequently inverted by inverter 430 and utilized to pull the P1WL signal to a logic low value at time t3. As previously mentioned, transistor 434 is also used to pull the P1WL signal to a logic low value. In this situation, when the P1CLK signal is negated substantially before the P2CLK signal, the P1WL signal is negated in response to the P1CLK signal. However, if the P2CLK signal has been negated at least one inverter stage delay earlier than the P1CLK signal, transistor 426 will pull the INTWL1 signal to a logic high value. The signal with the logic high value would subsequently be inverted by inverter 430 and used to negate the P1WL signal. Stated another way, the P2CLK signal would have to be a logic high value at least an inverter stage before the P1CLK signal was negated to affect a reset operation of the memory cell. Therefore, there is, in effect, an OR logic function for performing a reset operation on the memory cell. Inputs to this OR logic function include either a P1CLK signal or a delayed, inverted P2CLK signal. Again, it should be noted that both the P1CLK signal and the P2CLK signal must be provided to begin an evaluation stage of a dynamic circuit performed by wordline driver 310. In accordance with one embodiment of the present invention, there is an additional inversion delay in a path between a reset of the P1WL signal and an assertion of the P2WL signal than between a reset of the P1 W/L signal and the resetting of the P1 CLK signal.

To describe a relationship between the P1CLK signal, the P2CLK signal, the P1WL signal and the P2WL signal, the following logical expressions may be used.

$$P1WL = P1CLK \bullet \overline{P2CLK} \bullet P1IN; \text{ and} \quad (1)$$

$$P2WL = P2CLK \bullet \overline{P1CLK} \bullet P2IN. \quad (2)$$

By ensuring that this logical relationship is maintained, the P1WL and P2WL signals will not be asserted simultaneously or substantially concurrently.

Furthermore, for the P2WL signal to be restored and go to a logic low value at time t10, either the P2CLK signal must be negated or the asserted P1CLK signal must be inverted. In the example illustrated in FIG. 5, because the P1CLK signal is asserted much earlier than the P2CLK signal is negated, the P1CLK signal most probably has an opportunity to be inverted by inverter 422 and used to negate a logic value of the P2WL signal before the P2CLK signal is able to negate a value of P2WL.

Figure 6:
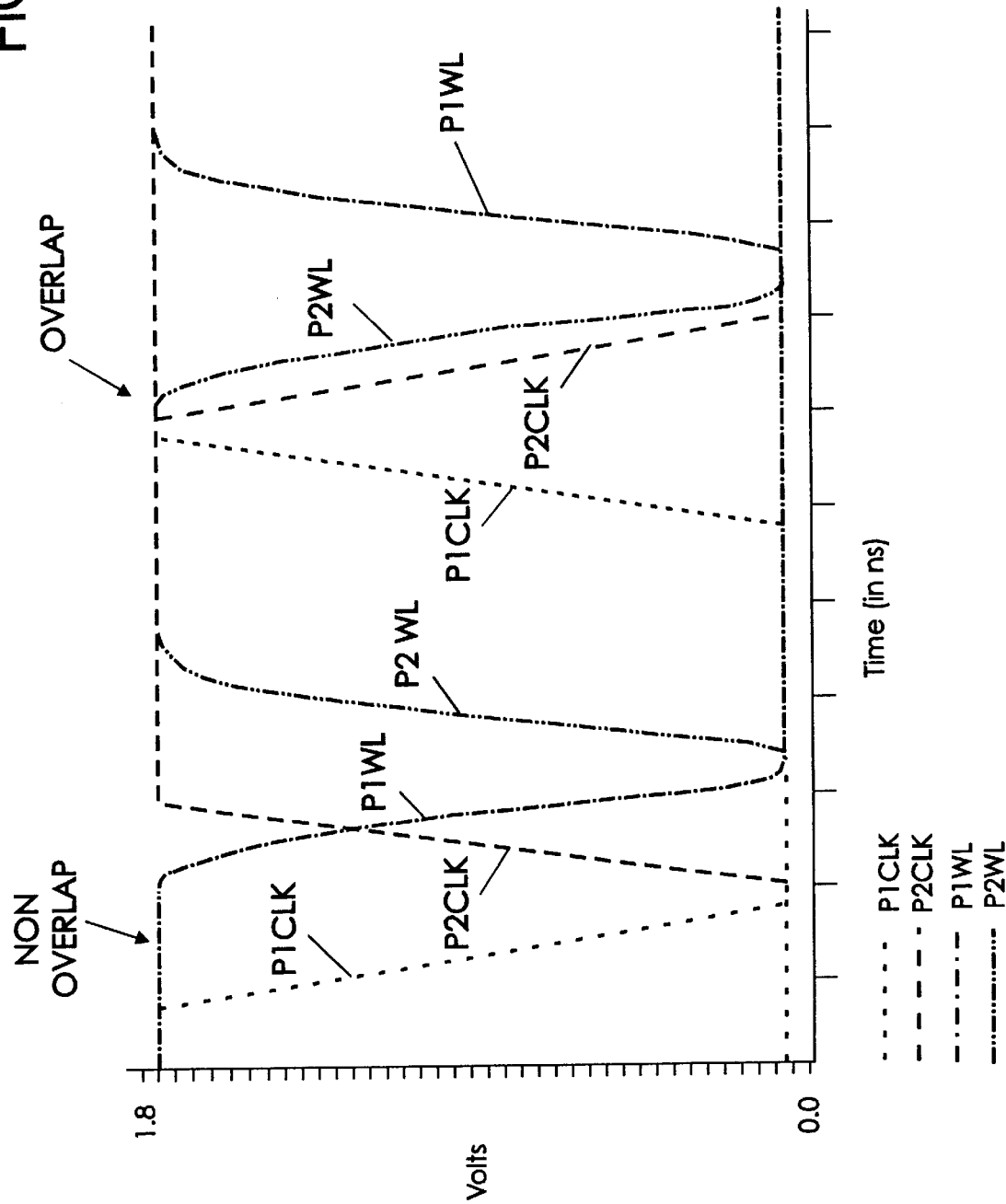
FIG. 6 illustrates, in timing diagram form, a plurality of wordline waveforms generated in accordance with one embodiment of the present invention.

FIG. 6 illustrates, in timing diagram form, the resulting P1WL and P2WL signals formed when a rising edge of the port two clock (P2CLK) arrives after the P1CLK (port one clock) signal has been negated and, therefore, there is no overlap between the clocking signals for each of the ports. As may be observed in a first portion of FIG. 6, the P1CLK signal and the P2CLK signals do not overlap at any point in time. In this situation, the circuit of the present invention negates the P1WL signal before the P2WL signal rises. Thus, when the P1CLK signal is negated, the P1WL signal is also negated. Additionally, when the P2CLK is asserted after the P1CLK signal has been negated, the P2WL signal is asserted, but does not overlap the P1WL signal at any point in time. As there is no overlap, there is no opportunity for an incorrect result to be output by the memory circuit. However, in an overlapping portion of FIG. 6, the P1CLK signal is still asserted when the P2CLK signal is negated. In this situation, the P1CLK and P2CLK signals are overlapping by a significant amount. In the second portion of the timing diagram of FIG. 6, the P2WL signal will negate to mirror the P2CLK signal. However, the P1WL signal will not begin to assert until the P2CLK signal has been inverted and, therefore, a delay associated with the inversion operation has passed. This period of time ensures that the P2WL and P1WL signals will not be simultaneously enabled during operation of the present invention. Note that there is very little difference between the time delta of the P2WL rise time and the P1WL fall time in comparison with the P1WL rise time and the P2WL fall time. In fact:

P1WL Rise–P2WL Fall >P2WL Rise–P1WL Fall, so that there is slightly more margin when there is some overlap, as opposed to no overlap.

Figure 7:
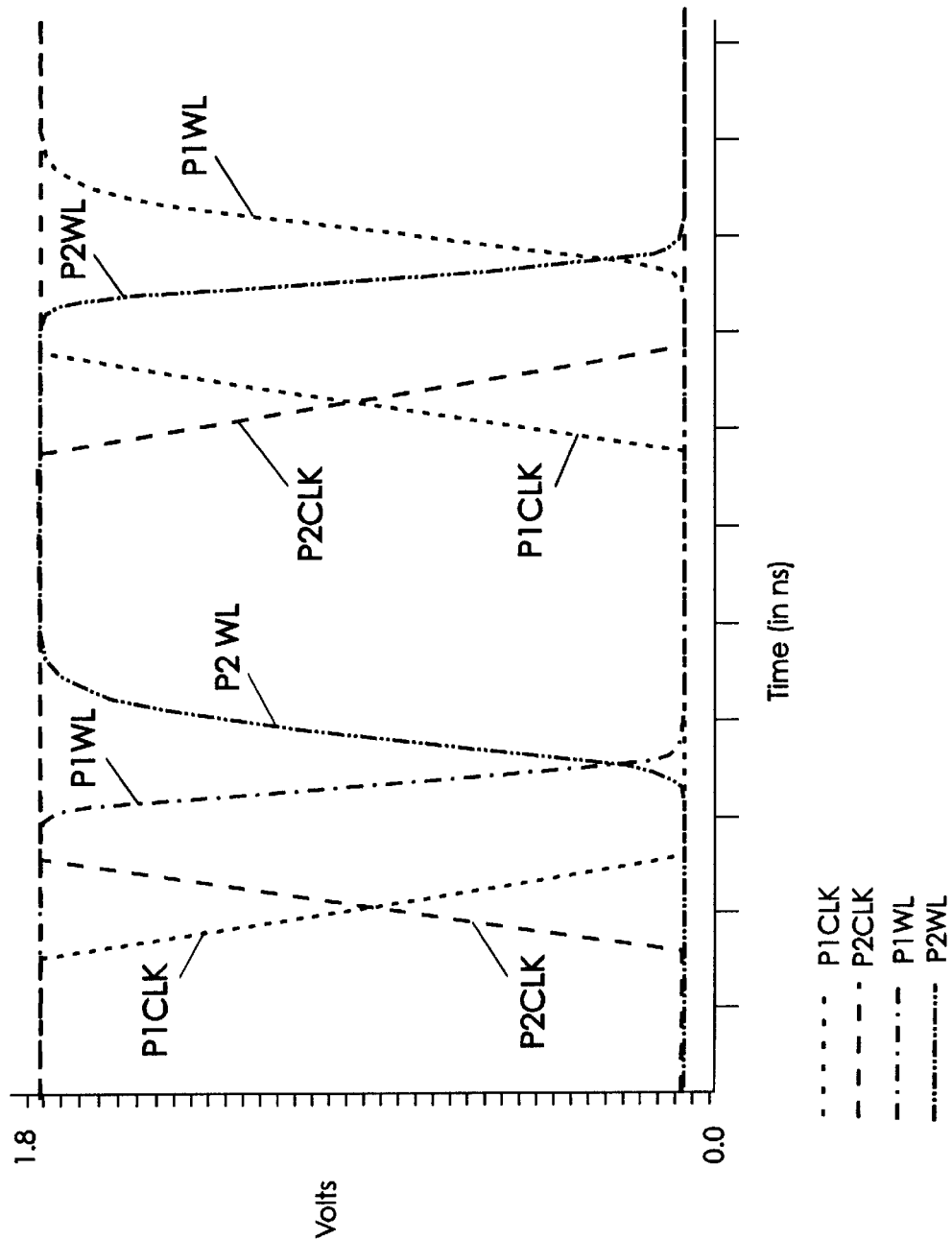
FIG. 7 illustrates, in timing diagram form, a plurality of waveforms generated in accordance with one embodiment to the present invention.

FIG. 7 illustrates a worst case scenario in which the P1CLK signal and the P2CLK signal have zero clock skew and are each switching at a 50% point. In FIG. 7, although the P1CLK signal goes low at the same time that the P2CLK signal is asserted, the P1CLK signal must be inverted. The delay associated with the inversion operation ensures that the P2WL signal will respond to negation of the P1CLK signal, rather than assertion of the P1CLK signal. By providing this delay, the portion of wordline driver 310 of the present invention is assured that a minimal overlap will occur between P1WL and P2WL. Note that the overlap between P1WL and P2WL is below a threshold voltage of transistors currently available in typical data processing applications and, therefore, any overlap has minimal or no effect. If more margin is needed, the inversion delay must be increased. In an alternate embodiment of the present invention, inverter 422 would be modified to implement three inverters to increase the delay and still have an inverting function. In a second half of FIG. 7, an opposite scenario is illustrated. In a second portion of FIG. 7, the P2CLK signal is being negated while the P1CLK signal is asserted. Again, an inverter delay through which the P2CLK signal is required to pass allows the P2CLK signal to determine an assertion of the P1WL signal.

Figure 8:
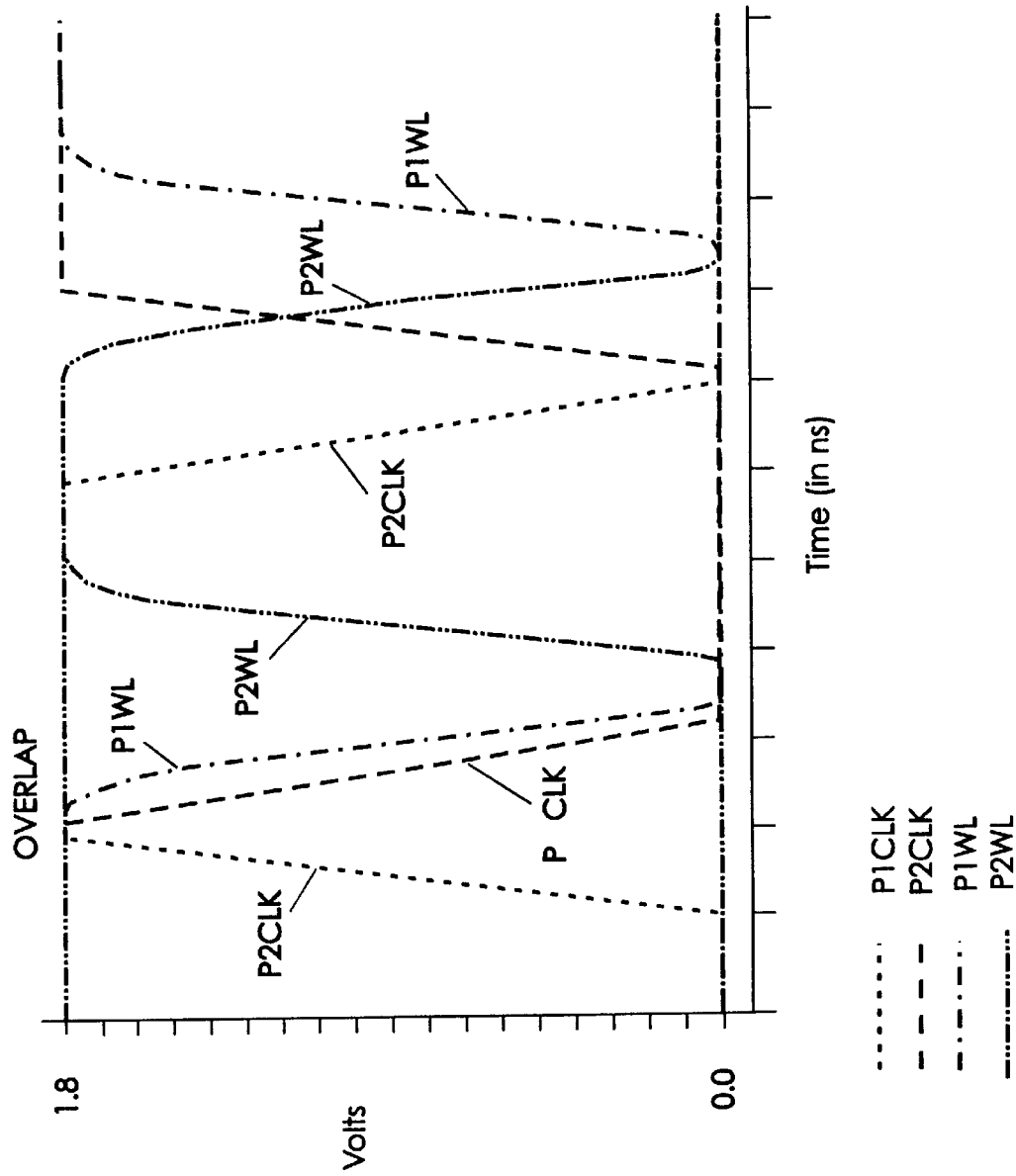
FIG. 8 illustrates, in timing diagram form, a plurality of waveforms generated in accordance with one embodiment of the present invention.

FIG. 8 illustrates the resulting signals when the P2CLK signal is asserted before the P1CLK signal is negated. Again, the results of this timing diagram illustrate that the P1WL signal does not overlap with the P2WL signal even when such overlap in the P2CLK and P1CLK signals occurs.

It should be noted that the description provided above allows a dual-port memory cell to be implemented using smaller devices, so that the dual-port memory cell has a smaller circuit area. Such smaller circuit areas result in memory devices which have higher densities as memory arrays which implement more memory cells in a same circuit area.

The use of non-overlapping wordlines allows the dual-port memory cell described above to be implemented. However, there are also other applications where it is important to ensure that overlapping input signals result in non-overlapping output signals. For example, assume that two input clocks who are overlapping when they are input, but must be non-overlapping for an application to which they are being provided. In this situation, a driver circuit such as that illustrated in FIG. 9 my be implemented. In FIG. 9, assume that the P1IN and P2IN signals are overlapping. During operation of the signal driver illustrated in FIG. 9, transistor 930, transistor 932, and transistor 934 must all be enabled to negate a first internal node, labeled INT 1. When the INT 1 node is asserted, the P1OUT signal is asserted. Furthermore, when either transistor 928 or 920 is enabled by providing a low logic level input signal to a P-channel device, the INT 1 node will be negated. When the INT 1 node is negated, the P1OUT signal is negated. Conversely, each of transistors 912, 914, and 916 must be enabled to pull a second internal node, labeled INT 2, to a logic low level. When the INT 2 node is asserted, the P2OUT signal is asserted. Conversely, if either transistor 904 or transistor 902 is enabled, that transistor will pull the INT 2 2 node to a high logic level and the P2OUT signal will then be negated.

During operation, either transistor 928 or transistor 920 may be used to restore the value of the P1OUT signal to a logic low value. To perform this operation, the P1 CLK signal is negated, and there are two transistor delays between the modification of the P1CLK signal and a remaining portion of the driver circuit of FIG. 9. Therefore, as soon as the P1CLK signal is negated, the negated signal restores the P1OUT signal through transistor 920. However, it is desired that both the P1CLK signal be asserted and the P2CLK signal be negated to activate the internal node INT 1. Therefore, the P2CLK signal is inverted using variable inverting delay 936. In this situation, there is always at least one inverter delay between the insertion of the P2CLK signal negation and the assertion of node INT 1.

It should be noted that transistors 902 through 906, and 910 through 916 function in a manner similar to transistors 920, 922, and 926 through 934, respectively. As both the circuits operate similarly, operation of the circuit providing the P2OUT signal will not be described in greater detail herein.

FIG. 10 illustrates an alternate embodiment of the present invention in which two overlapping clock signals are input to the circuit of the present invention. A resulting output comprises two non-overlapping clock signals. During operation of the clock generation circuit of FIG. 10, transistor 1028 and 1030 must both be enabled to assert a first internal node, labeled INT 1. When the INT 1 node is asserted, the P1 Clock signal is asserted. Furthermore, when either transistor 1020 or transistor 1018 is enabled by providing a low logic level input signal to a P-channel device, the INT 1 node will go to a positive logic value. When the INT 1 node goes to a positive value and is restored, the P1 Clock signal is negated. Conversely, each of transistors 1012 and 1014 must be enabled to pull a second internal node, INT 2, to a logic low level. When the INT 2 node is asserted, the P2 Clock signal is asserted. Alternatively, if either transistor 1004 or transistor 1002 is enabled, that transistor will pull the INT 2 node to a high logic level. The P2 Clock signal will then be negated.

During operation, either transistor 1020 or transistor 1018 may be used to restore a value of the P1 Clock (non-overlapping) signal to a logic low value. When this operation is performed, the P1 Clock (overlapping) signal is not inverted, and there is no delay between the modification of the P1 Clock (overlapping) signal and a remaining portion of the driver circuit. Therefore, as soon as the P1 Clock (overlapping) signal is negated, the negated signal restores the P1 Clock (non-overlapping) signal through transistor 1018. However, it is desired that both the P1 Clock (overlapping) signal be asserted and the P2 Clock (overlapping) signal be negated to activate internal node INT 1. Therefore, the P2 Clock (overlapping) signal is inverted using variable inverting delay circuit 1032. In this situation, there is always at least one more inverter delay between the insertion of the P2 Clock (overlapping) signal and the activation of node INT 1. It should be noted that transistors 1002 through 1006, and 1010 through 1014 function in a manner similar to transistors 1018 through 1022 and 1026 through 1030, respectively. As both circuits operate similarly, operation of the circuit providing the P2 Clock (non-overlapping) signal will not be described in greater detail herein.

While there have been described herein the principles of the invention, it is to be clearly understood to those skilled in the art that this description is made by way of example only and not as a limited to the scope of the invention. Accordingly, it is intended, by the appended claims, to cover all modifications of the invention which fall within the true spirit and scope of the invention.

What is claimed is:

1. A circuit, comprising:
    input means for receiving a first input signal and a second input signal;
    a delay circuit for receiving the second input signal and delaying the second input signal to provide a delayed second input signal and for receiving the first input signal and delaying the first input signal to provide a delayed first input signal;
    a first logic circuit for selectively asserting an active logic state for a first output signal in response to the first input signal and the delayed second input signal; and
    a second logic circuit for asserting an active logic state for a second output signal in response to the second input signal and the delayed first input signal, wherein only one of the first input signal and the second input signal has its active state asserted at a time.

2. The circuit of claim 1 wherein the first input signal is a first clock signal and the second input signal is a second clock signal, wherein each of first clock signal and the second clock signal have an active and an inactive state.

3. The circuit of claim 2 wherein at least a portion of the first clock signal and the second clock signal active states occur concurrently.

4. The circuit of claim 3 wherein the second logic circuit selectively places the second output signal in an inactive state during an interval when the second clock signal is negated.

5. The circuit of claim 1 wherein the input means receives a first data signal and wherein the first logic circuit places the first output in an active state during an interval when the first input signal is asserted, the delayed second input signal is asserted, and the first data signal is asserted.

6. The circuit of claim 1 wherein the first logic circuit selectively places the first output signal in an inactive state during an interval when the first input signal is negated.

7. The circuit of claim 1, further comprising:

a first restore circuit for selectively placing the first output signal in an inactive state upon receipt of one of the first input signal in an active state and the delayed second input signal in an active state.

8. The circuit of claim 7, further comprising:
    a second restore circuit for selectively placing the second output signal in an inactive state upon receipt of one of the second input signal in an active state and the delayed first clock input in an active state.

9. The circuit of claim 1, further comprising:
    latch means coupled to the first output signal to store the first output signal and coupled to the second output signal to store the second output signal.

10. The circuit of claim 1, further comprising:
    an inverting circuit for receiving the second input signal and the first input signal, the inverting circuit inverting the second input signal to provide an inverted second input signal and the inverting circuit inverting the first input signal to provide an inverted first input signal.

11. The circuit of claim 10, wherein the first output signal and the second output signal are out-of-phase.

12. A circuit for providing a plurality of output signals, comprising:
    a delay circuit for receiving a first clock signal and a second clock signal, the delay circuit delaying the first clock signal to provide a first delayed clock signal and delaying the second clock signal to provide a second delayed clock signal;
    a first logic circuit having a first input coupled to the delay circuit for receiving the second delayed clock signal, having a second input for receiving the first clock signal, and having a third input for receiving a first data signal, the first logic circuit selectively asserting a first internal node in response to the second delayed clock signal, the first clock signal, and the first data signal; and
    first restore means coupled to the first logic circuit for selectively negating the first internal node in response to one of the first clock signal and the second delayed clock signal, wherein the first restore means selectively negates the first internal node before a second internal node is asserted.

13. The circuit of claim 12, further comprising:
    a second logic circuit having a first input coupled to the delay circuit for receiving the first delayed clock signal, having a second input for receiving the second clock signal, and having a third input for receiving a second data signal, the second logic circuit selectively asserting a second internal node in response to the first delayed clock signal, the second clock signal, and the second data signal; and
    second restore means coupled to the second logic circuit for selectively negating the second internal node in response to one of the second clock signal and the first delayed clock signal, wherein the second restore means selectively negates the second internal node prior to the first internal node being asserted.

14. The circuit of claim 13, further comprising:
    first latch means coupled to the first internal node, the first latch means storing a first logic state corresponding to the first internal node and providing the first logic state as a first output signal; and
    second latch means coupled to the second internal node, the second latch means storing a second logic state corresponding to the second internal node and providing the second logic state as a second output signal.

15. The circuit of claim 14 wherein the first output signal and the second output signal are non-overlapping.

16. The circuit of claim 15, wherein the first clock signal and the second clock signal are over-lapping.

17. A method comprising the steps of:

receiving a first input signal and a second input signal;

delaying the second input signal to provide a delayed second input signal and delaying the first input signal to provide a delayed first input signal;

selectively asserting an active logic state for a first output signal in response to the first input signal and the delayed second input signal; and asserting an active logic state for a second output signal in response to the second input signal and the delayed first input signal, wherein only one of the output signals has its active state asserted at a time.

18. The method of claim 17 wherein at least a portion of the first input signal and the second input signal active states occur concurrently.

19. The method of claim 18 further comprising the step of:

receiving a first data signal and the second output in an active state in response to the first input signal, the delayed second input signal, and the first data signal being asserted.

20. The method of claim 17 comprising the step of:

selectively placing the first output signal in an active state in response to the first input signal being in an active state and the delayed second input signal being an active state.

* * * * *

UNITED STATES PATENT AND TRADEMARK OFFICE
CERTIFICATE OF CORRECTION

PATENT NO.    : 5,870,349
DATED         : Feb. 9, 1999
INVENTOR(S)   : George McNeil Lattimore, et al It is certified that error appears in the above-identified patent and that said Letters Patent is hereby corrected as shown below:

The title page, should be deleted to be replaced with the attached page.

Signed and Sealed this

Thirty-first Day of August, 1999

Attest:

Q. TODD DICKINSON

*Attesting Officer*            *Acting Commissioner of Patents and Trademarks*

United States Patent [19]
Lattimore et al.

[11] Patent Number: 5,870,349
[45] Date of Patent: Feb. 9, 1999

[54] DATA PROCESSING SYSTEM AND METHOD FOR GENERATING MEMORY CONTROL SIGNALS WITH CLOCK SKEW TOLERANCE

[75] Inventors: George McNeil Lattimore, Austin; Robert Anthony Ross, Jr., Cedar Park; Mithkal Moh'd Smadi, Round Rock, all of Tex.

[73] Assignee: International Business Machines Corporation, Armonk, N.Y.

[21] Appl. No.: 959,653

[22] Filed: Oct. 28, 1997

[51] Int. Cl.[6] .................................. G11C 7/00
[52] U.S. Cl. .......................... 365/230.06; 365/194
[58] Field of Search ................ 365/230.06, 194, 365/233, 230.05

[56] References Cited

U.S. PATENT DOCUMENTS

| | | | |
|---|---|---|---|
| 4,366,558 | 12/1982 | Homma et al. | 365/189 |
| 4,608,669 | 8/1986 | Klara et al. | 365/201 |
| 4,803,663 | 2/1989 | Miyamoto et al. | 365/189 |
| 4,980,860 | 12/1990 | Houston et al. | 365/189.11 |
| 5,107,459 | 4/1992 | Chu et al. | 365/63 |
| 5,144,583 | 9/1992 | Oowaki et al. | 365/206 |
| 5,214,601 | 5/1993 | Hidaka et al. | 365/63 |
| 5,292,678 | 3/1994 | Dhong et al. | 437/50 |
| 5,459,851 | 10/1995 | Nakajima et al. | 395/476 |
| 5,468,985 | 11/1995 | Harima | 257/385 |
| 5,563,820 | 10/1996 | Wada et al. | 365/63 |
| 5,567,963 | 10/1996 | Rao | 257/296 |
| 5,577,003 | 11/1996 | Fuji | 365/230.06 |
| 5,581,126 | 12/1996 | Moench | 257/776 |
| 5,586,072 | 12/1996 | Longway et al. | 365/63 |

*Primary Examiner*—Vu A. Le
*Attorney, Agent, or Firm*—Winstead Sechrest & Minick P.C.; Elizabeth A. Apperley; Anthony V. S. England

[57] ABSTRACT

The data processing system of the present invention implements a multi-port memory cell, wherein the port functions are divided based on a timing cycle in which they may be accessed. For example, in one case, a first port may be utilized only for read operations and accessed only during a first portion of the timing cycle. Similarly, a second port may be used for read or write operations a and may be accessed only during a second portion of the timing cycle. To ensure that the multi-port memory cell functions correctly, both ports should not be accessed simultaneously. A circuit and method are implemented to ensure that both ports are not accessed simultaneously by implementing a delay function in a unique and useful manner.

20 Claims, 9 Drawing Sheets

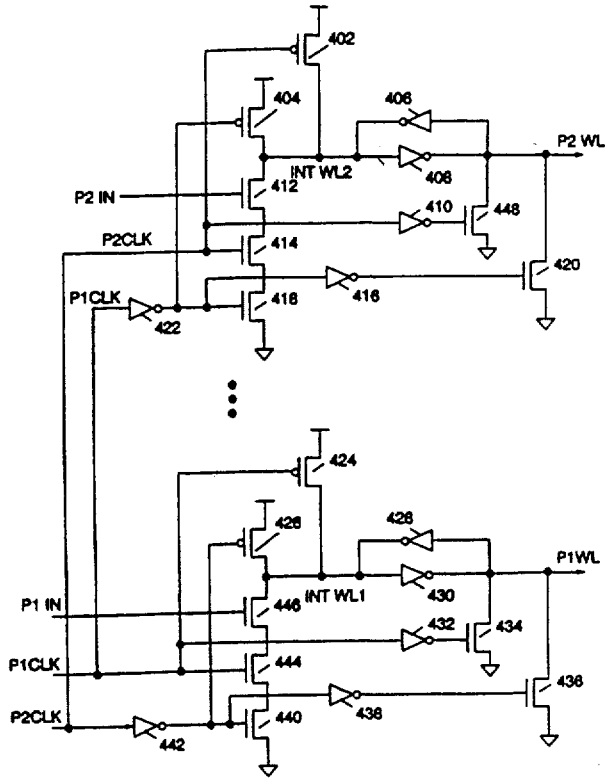

UNITED STATES PATENT AND TRADEMARK OFFICE
CERTIFICATE OF CORRECTION

PATENT NO  : 5,870,349

DATED      : February 9, 1999

INVENTOR(S) : George McNeil Lattimore, Robert Anthony Ross, Jr., and Mithkal Moh'd Smadi It is certified that error appears in the above-identified patent and that said Letters Patent is hereby corrected as shown below:

Col. 4, line 10:   Delete "A, B and C illustrate" and insert --illustrates-- thereto.
Col. 14, line 47:  Delete "P2OUT" and insert --P2OUT-- thereto.
Replace Figure 1 as follows:

FIG. 1
PRIOR ART

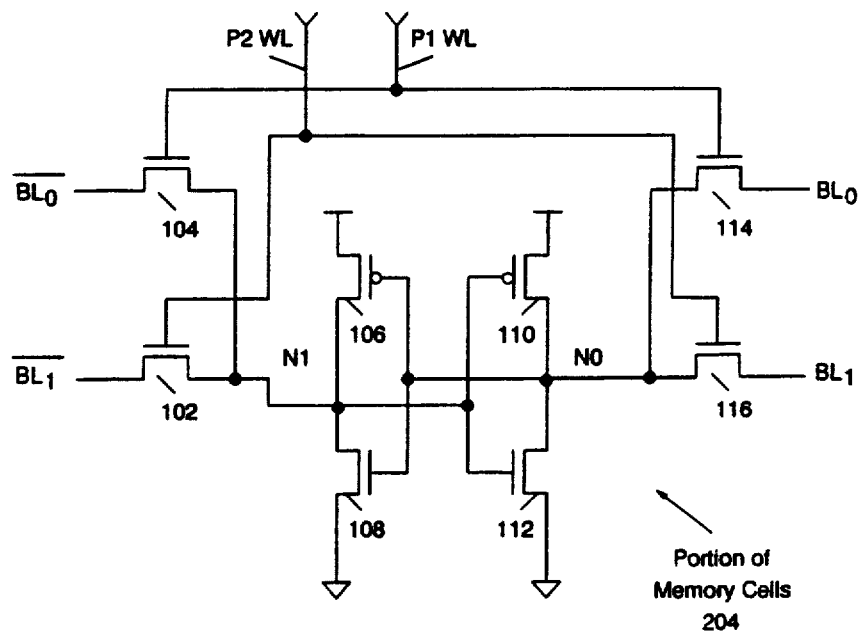

UNITED STATES PATENT AND TRADEMARK OFFICE
CERTIFICATE OF CORRECTION

PATENT NO    :   5,870,349

DATED        :   February 9, 1999

INVENTOR(S)  :   George McNeil Lattimore, Robert Anthony Ross, Jr., and Mithkal Moh'd Smadi It is certified that error appears in the above-identified patent and that said Letters Patent is hereby corrected as shown below:

Replace Figure 2 as follows:

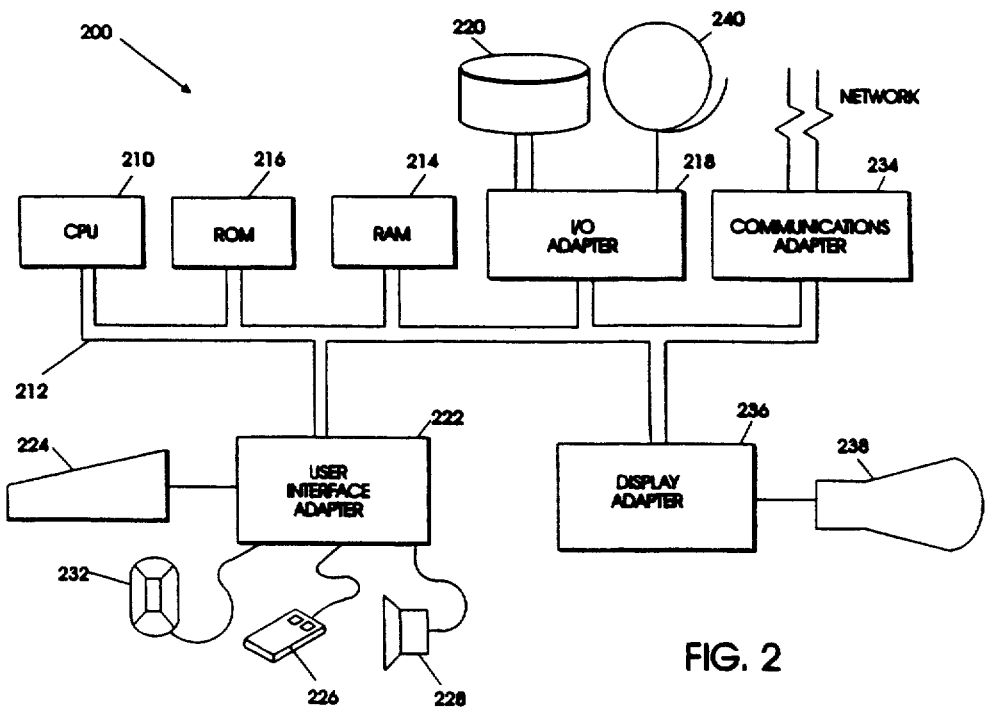

FIG. 2

UNITED STATES PATENT AND TRADEMARK OFFICE
CERTIFICATE OF CORRECTION

PATENT NO : 5,870,349

DATED : February 9, 1999

INVENTOR(S) : George McNeil Lattimore, Robert Anthony Ross, Jr., and Mithkal Moh'd Smadi It is certified that error appears in the above-identified patent and that said Letters Patent is hereby corrected as shown below:

Replace Figure 3 as follows:

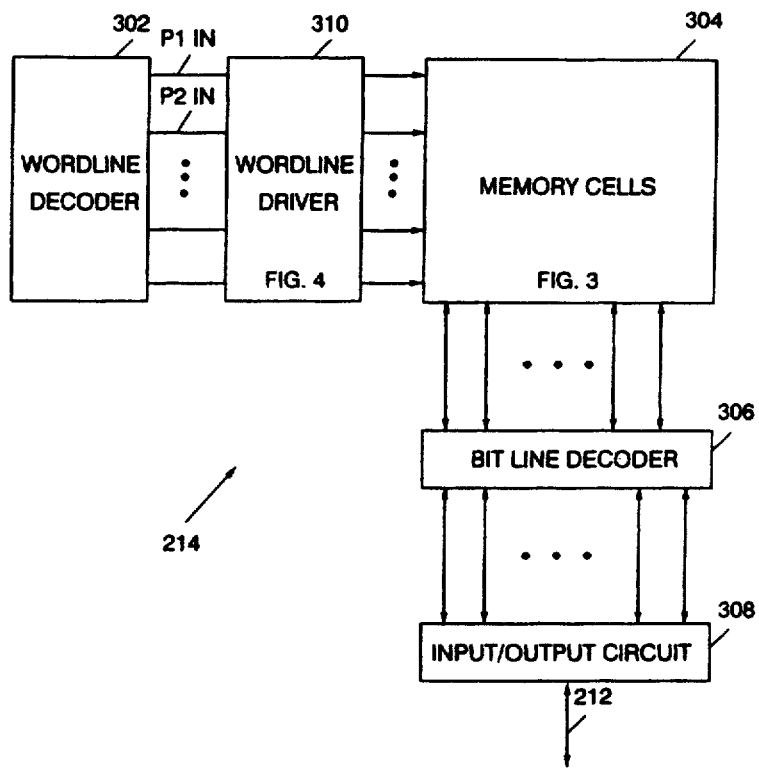

FIG. 3

UNITED STATES PATENT AND TRADEMARK OFFICE
CERTIFICATE OF CORRECTION

PATENT NO : 5,870,349

DATED : February 9, 1999

INVENTOR(S) : George McNeil Lattimore, Robert Anthony Ross, Jr., and Mithkal Moh'd Smadi It is certified that error appears in the above-identified patent and that said Letters Patent is hereby corrected as shown below:

Replace Figure 4 as follows:

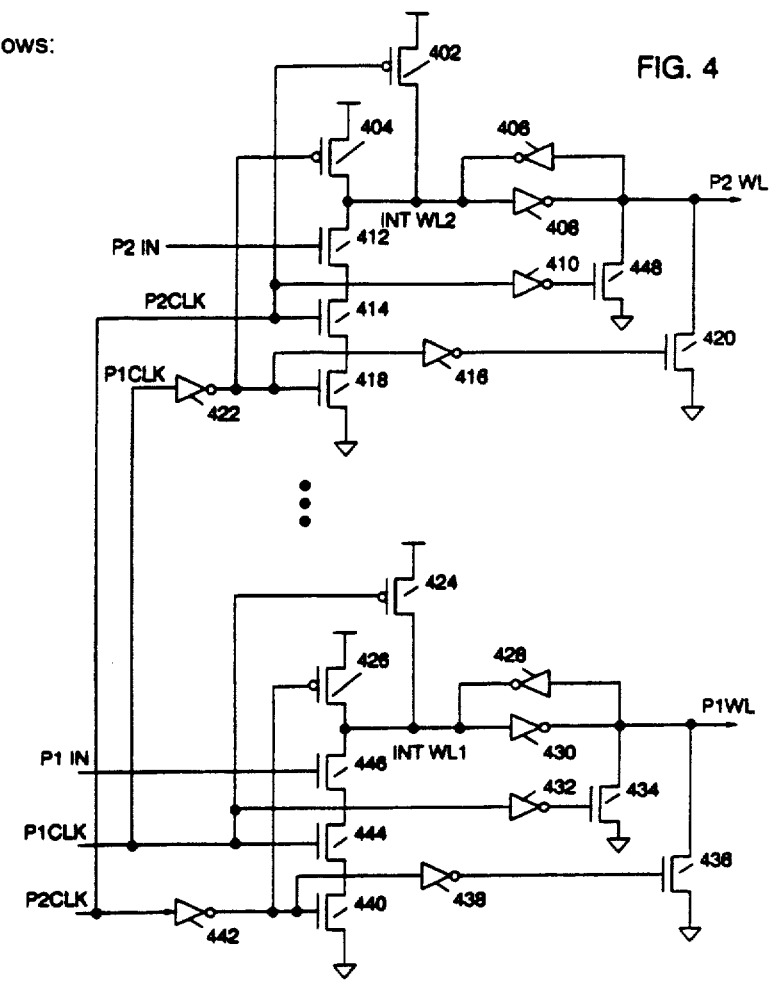

FIG. 4

UNITED STATES PATENT AND TRADEMARK OFFICE
CERTIFICATE OF CORRECTION

PATENT NO : 5,870,349

DATED : February 9, 1999

INVENTOR(S) : George McNeil Lattimore, Robert Anthony Ross, Jr., and Mithkal Moh'd Smadi It is certified that error appears in the above-identified patent and that said Letters Patent is hereby corrected as shown below:

Replace Figure 5 as follows:

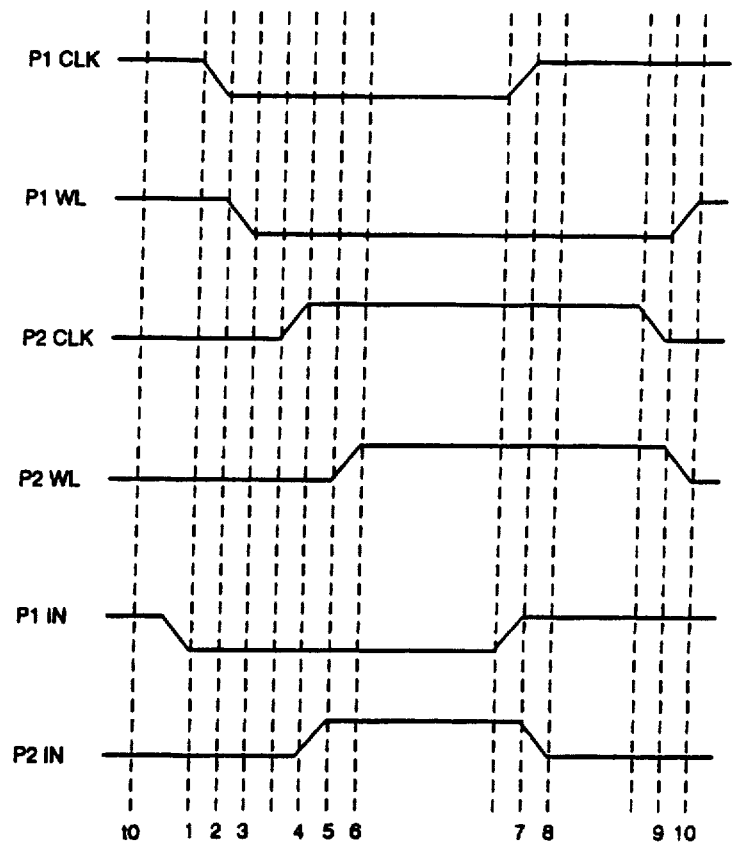

FIG. 5